(12) United States Patent
Wu et al.

(10) Patent No.: US 6,355,499 B1
(45) Date of Patent: Mar. 12, 2002

(54) METHOD OF MAKING BALL GRID ARRAY PACKAGE

(75) Inventors: Shyh-Ing Wu, Kaohsiung Hsien; Shin Hua Chao, Kaohsiung; Yao Shin Fang, Hua Lian, all of (TW)

(73) Assignee: Advanced Semiconductor Engineering. Inc., Kaohshiung (TW)

( * ) Notice: Subject to any disclaimer, the term of this patent is extended or adjusted under 35 U.S.C. 154(b) by 36 days.

(21) Appl. No.: 09/610,859

(22) Filed: Jul. 6, 2000

(51) Int. Cl.[7] .......................... H01L 21/44; H01L 21/48; H01L 21/50
(52) U.S. Cl. .......................................... 438/106; 438/51
(58) Field of Search .............................. 438/26, 51, 64, 438/106, 108, 112, 118, 119, 122, 123, 124, 126, 127, 612, 613, 617

(56) References Cited

U.S. PATENT DOCUMENTS

| | | | |
|---|---|---|---|
| 5,532,513 A | * | 7/1996 | Smith et al. ................. 257/703 |
| 5,796,038 A | * | 8/1998 | Manteghi .................... 174/52.4 |
| 5,961,912 A | | 10/1999 | Huang et al. ........... 264/272.15 |

* cited by examiner

Primary Examiner—David Nelms
Assistant Examiner—David Nhu

(57) ABSTRACT

A method of making a ball grid array package comprises the steps of: (a) providing a film having an opening defined therein; (b) placing the film on a substrate; (c) attaching a semiconductor chip onto the substrate such that the semiconductor chip is positioned in the opening of the film; (d) electrically coupling the semiconductor chip to the substrate; (e) providing a molding die having a runner, a gate and a molding cavity defined therein, wherein the runner is connected to the molding cavity through the gate; (f) closing and clamping the molding die in a manner that the semiconductor chip is positioned in the molding cavity wherein the edges of the molding cavity fit entirely within the opening of the film and the edges of the runners and the gates are entirely positioned against the film; (g) transferring a hardenable molding compound into the molding cavity; (h) hardening the molding compound; (i) unclamping and opening the molding die; and (j) simultaneously removing the film and degating. The film in accordance with the present invention is characterized in that the adhesive force between the film and the molding compound is greater than the adhesive force between the film and the substrate. This makes the film tend to adhere to the excess molding compound; hence, the film will be removed along with the excess molding compound during the step (j) thereby automating the molding process.

11 Claims, 4 Drawing Sheets

METHOD OF MAKING BALL GRID ARRAY PACKAGE

BACKGROUND OF THE INVENTION

1. Field of the Invention

This invention generally relates to an encapsulating method for use in forming a ball grid array (BGA) package, and more particularly to a molding method for use in forming a BGA package having a cavity down configuration.

2. Description of the Related Art

BGA packages are roughly classified in two types, i.e. "cavity-up" type and "cavity-down" type in view of manner of incorporating a chip. The cavity-down BGA package typically comprises a chip disposed in a cavity formed in a upper surface of a substrate. Bonding pads formed on the active surface of the chip are connected to chip connection pads formed on the upper surface of the substrate around the cavity through a plurality of bonding wires. The upper surface of the substrate is provided with a plurality of solder pads arranged about the periphery of the chip connection pads. The solder pads are electrically connected to the chip connection pads, respectively. Each solder pad has a solder ball mounted thereon for making external electrical connection. The chip, the bonding wires and the cavity of the substrate are encapsulated in a package body. The package body is typically formed by a transfer molding process FIG. 1 shows a conventional molding device 100 for use in forming a cavity down BGA package. As shown, the molding device 100 mainly comprises a molding die having a runner 110, a gate 120 and a molding cavity 130. The runner 110 extends from a pot (not shown) and connects to the molding cavity 130 through the gate 120. After molding compound is positioned in the pot, the molding die is closed and clamped, and a transfer ram (not shown) is moved down in the pot to compress the molding compound. The molding die and molding compound are pre-heated so that when the transfer ram compresses the molding compound, the liquefied molding compound is forced through the runner 110 and the gate 120 to fill the cavity 130 so as to encapsulate the chip. When the molding compound fills the cavity 130, the transfer ram stands still for a predetermined time until the molding compound cures. Then the transfer ram is raised, the molding die is opened, and the molded product is removed from the molding die. However, the molding compound not only fills the molding cavity 130 but also fills the gate 120, the runner 110 and the pot. Typically, this resulted excess molding compound must be removed from the molded product. Therefore, the molding device 100 further comprises a metal shim 140 for separating the excess molding compound from the substrate thereby protecting the substrate from being twisted or damaged during "degating" process, i.e., the removal of the excess molding compound.

FIG. 2 shows another molding device 200 for use in forming a cavity down BGA package. The molding device 200 is characterized by comprising a side gate 150 for separating the excess molding compound from the substrate.

However, one shortcoming of the above conventional molding devices is apparent. Specifically, it is difficult—if not impossible—to automate a molding process using the conventional molding devices described above because the metal shim 140 or side gate 150 can not be simultaneously removed during the degating process. After the excess molding compound is removed, the metal shim 140 or side gate 150 will interfere with automatic ejection of the molded product by moveable pins built in the molding die. Therefore, the metal shim 140 or side gate 150 must be removed manually before ejection of the molded product. This will causes substantial molding down-time and increase the cycle time for the whole process.

Further, the metal shim 140 or side gate 150 may be deformed due to clamping pressure after long term use. This may cause "flash" (i.e. molding material that extends beyond the cavity) thereby adversely affecting the solder joint reliability of the solder pads.

SUMMARY OF THE INVENTION

It is an object of the present invention to provide a method of making a ball grid array package which utilizes a film to separate excess molding compound from the substrate wherein the film is allowed to be simultaneously removed during the degating process thereby automating the molding process.

It is another object of the present invention to provide a method of making a ball grid array package which utilizes a film to reduce the occurrence of flash during molding process.

To achieve these and other advantages and in accordance with the purpose of the present invention, as embodied and broadly described, a method of making a ball grid array package comprises the steps of: (a) providing a film having an opening defined therein; (b) placing the film on a substrate; (c) attaching a semiconductor chip onto the substrate such that the semiconductor chip is positioned in the opening of the film; (d) electrically coupling the semiconductor chip to the substrate; (e) providing a molding die having a runner, a gate and a molding cavity defined therein, wherein the runner is connected to the molding cavity through the gate; (f) closing and clamping the molding die in a manner that the semiconductor chip is positioned in the molding cavity wherein the edges of the molding cavity fit entirely within the opening of the film and the edges of the runners and the gates are entirely positioned against the film; (g) transferring a hardenable molding compound into the molding cavity; (h) hardening the molding compound; (i) unclamping and opening the molding die; and (j) simultaneously removing the film and degating.

The film in accordance with the present invention is characterized in that the adhesive force between the film and the molding compound is greater than the adhesive force between the film and the substrate. This makes the film tend to adhere to the excess molding compound; hence, the film will be removed along with the excess molding compound during the step (j) thereby automating the molding process. Further, the film can be a disposable film; hence, the deformation problem due to repeating use can be avoided. Therefore, the flash problem can be significantly reduced by using a new film for each molding operation.

DETAILED DESCRIPTION OF THE PREFERRED EMBODIMENT

Figure 1:
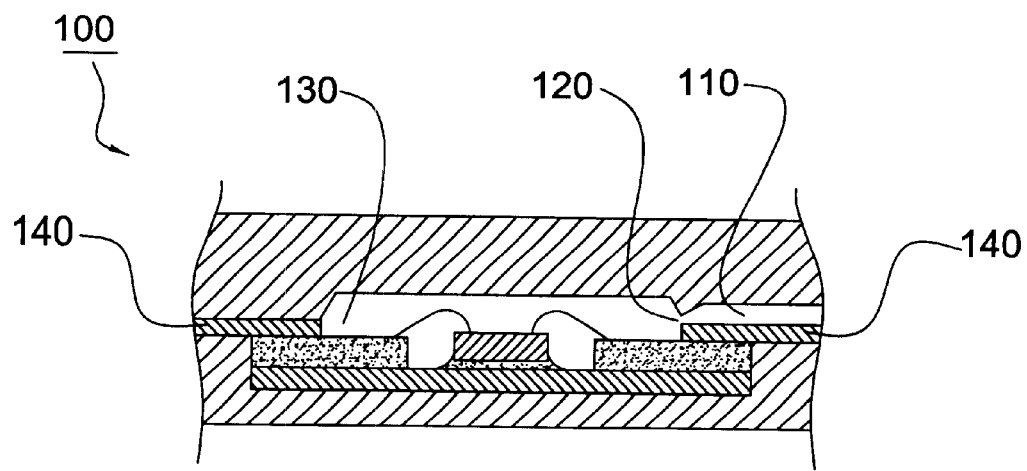
FIG. 1 is a cross sectional view of a conventional molding device for use in forming a cavity down BGA package.
Figure 2:
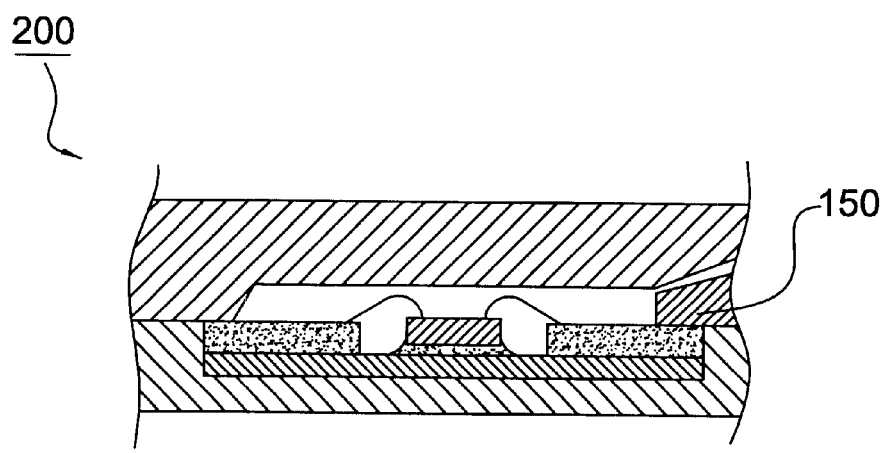
FIG. 2 is a cross sectional view of another conventional molding device for use in forming a cavity down BGA package.
Figure 3:
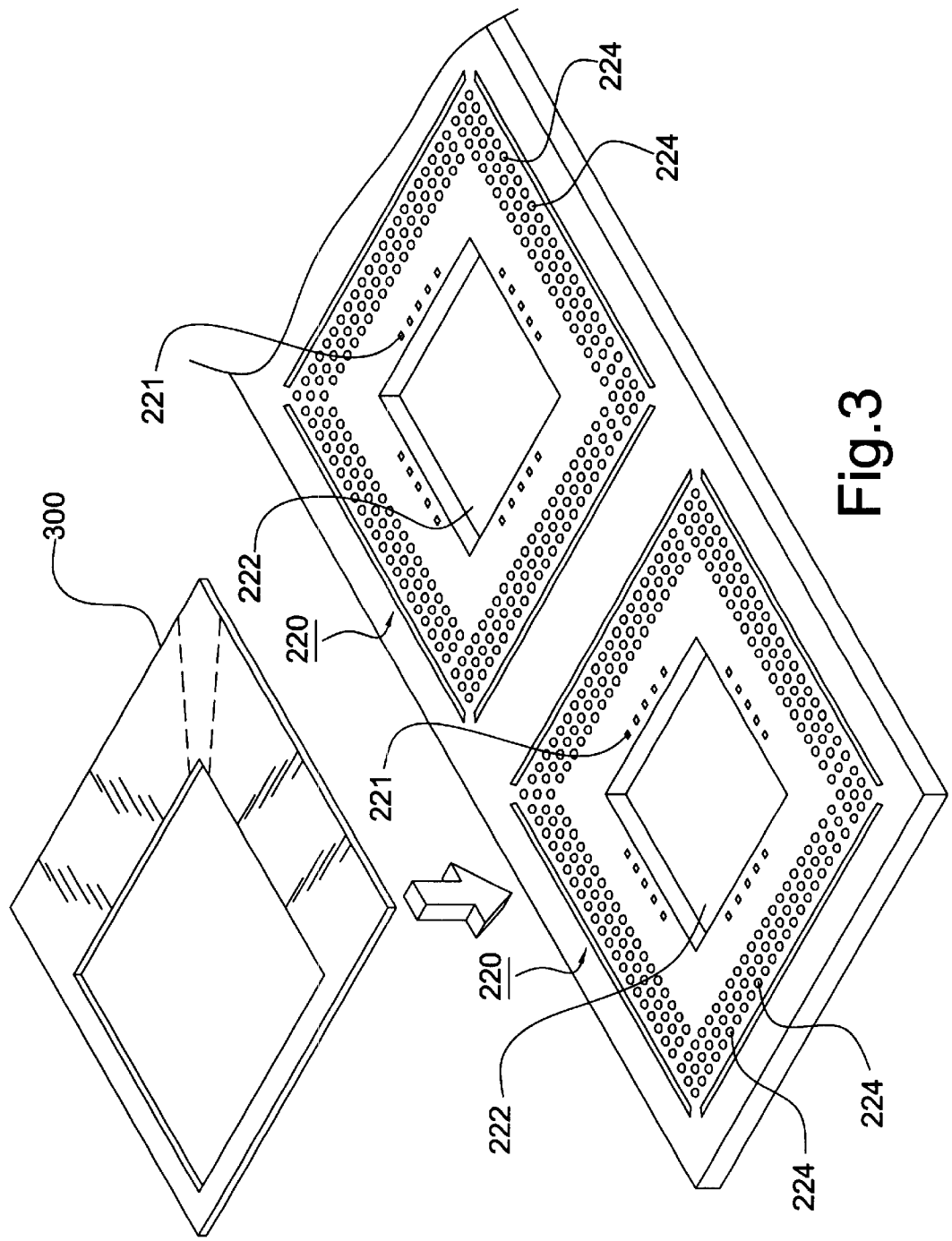
FIGS. 3–7 are used for illustrating a method of making a ball grid array package in accordance with the present invention.

FIGS. 3–7 illustrate a method of making a ball grid array package in accordance with the present invention FIG. 3 shows two substrates 220 and a film 300 having an opening. In production, it is desirable to integrally form a plurality of substrates in a strip (typically referred to as a "substrate strip") having alignment holes so that the packaging process can be automated. The substrate 220 has a cavity 222 formed in the upper surface thereof. The upper surface of the substrate 220 is provided with a plurality of chip connection pads 221 around the periphery of the cavity 222 and a plurality of solder pads 224 arranged about the periphery of the chip connection pads, wherein the solder pads 224 are electrically connected to corresponding chip connection pads.

Preferably, the film 300 is made of heat-resistant material that does not warp during the molding process, i.e., that can resist working temperature of molding process (about 175° C.). The adhesive force between the film 300 and the molding compound is greater than the adhesive force between the film 300 and the substrate 220. Preferably, the adhesive force between the film 300 and the molding compound is ten times greater than the adhesive force between the film 300 and the substrate 220. Suitable materials for the film 300 include, for example, Teflon (polytetrafluoroethylene, PTFE) or ETFE (ethylene tetrafluoroethylene).

Figure 4:
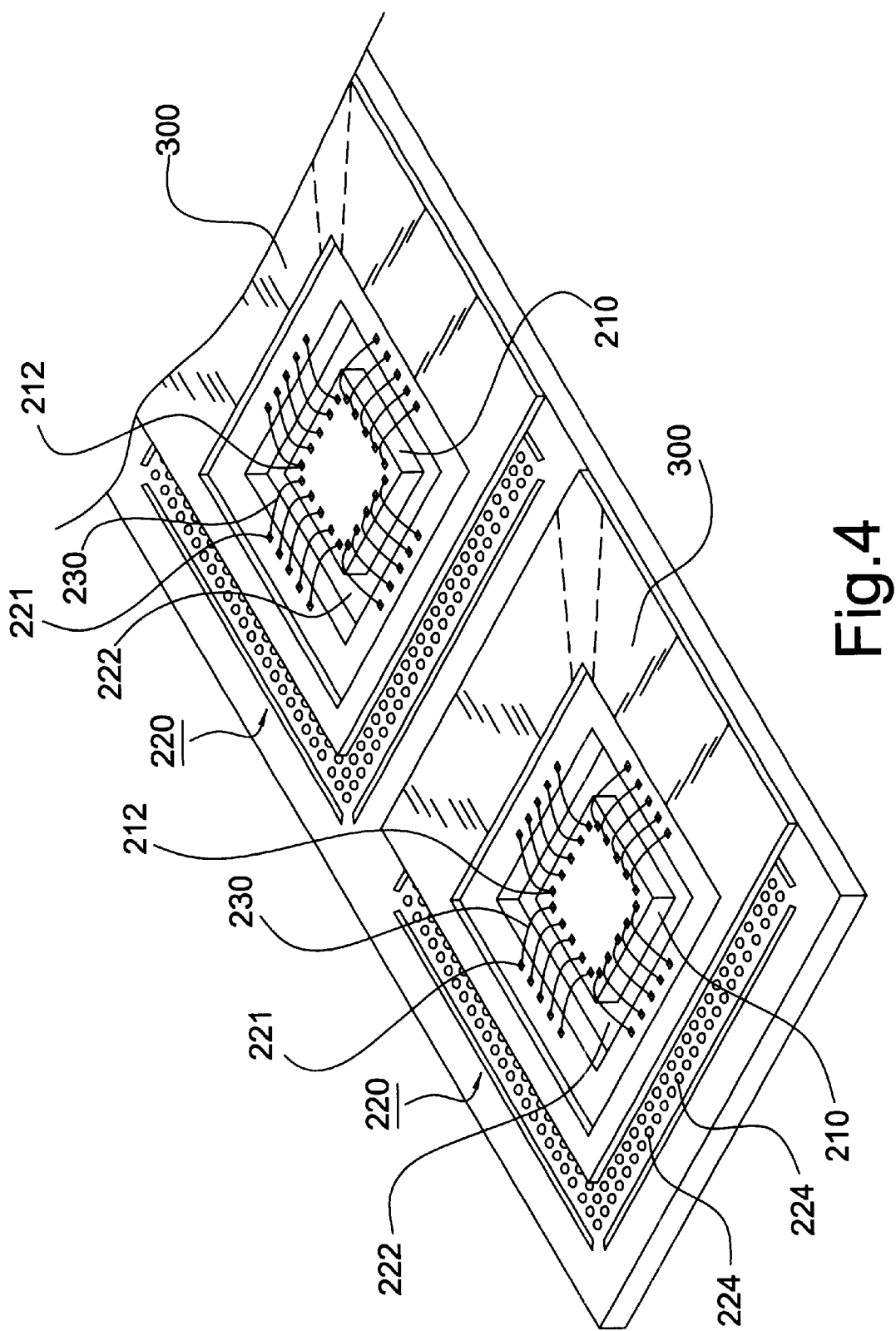

Referring to FIG. 4, firstly, the film 300 is placed on the upper surface of the substrate 220 in a manner that the chip connection pads on the substrate are positioned within the opening of the film 300. Then, a semiconductor chip 210 is attached to the cavity 222 of the substrate 220 through an electrically conductive adhesive such as silver paste. The semiconductor chip 200 has a plurality of bonding pads 212 formed at its active surface for electrically accessing the inner circuits thereof. A plurality of bonding wires such as gold wires 230 are connected to the chip connection pads on the substrate and corresponding bonding pads of the semiconductor chip 210 using known wire bonding techniques.

Typically, the solder pads 224 on the substrate 220 are arranged in a plurality of rows around the cavity 222 of the substrate 220 (see FIG. 3). When the film 300 is placed on the substrate 220, it is preferred that the film 300 covers the inner rows of solder pads 224 positioned next to the cavity 222 of the substrate 220. Thus, flash problems can be significantly reduced, thereby assuring the solder joint reliability of those solder pads 224 positioned next to the cavity 222 of the substrate 220.

Figure 5:
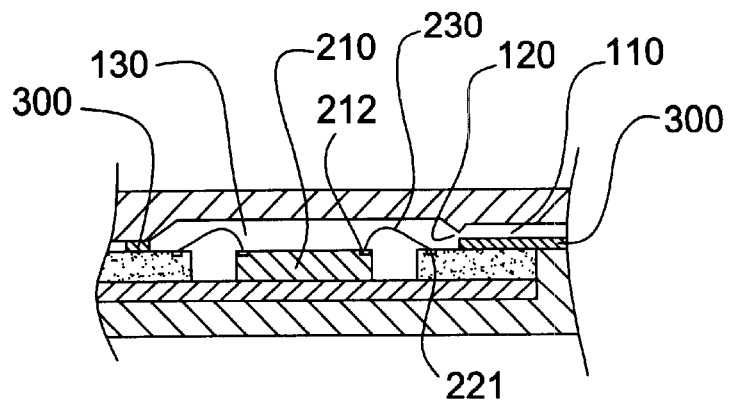

Referring to FIG. 5, when the molding die is closed and clamped, the semiconductor chip 210 is positioned in a molding cavity 130 shaped generally to conform the to-be-molded shape of the final BGA package. After that, a hardenable molding compound is transferred into the molding cavity 130 through runner 110 and gate 120. It is noted that the edges of the molding cavity 130 fit entirely within the opening of the film 300 and the edges of the runner 110 and the gate 120 are entirely positioned against the film 300. At this time, the film 300 can provide better sealing effect to prevent flash from forming on the upper surface of the substrate such that contamination of the solder pads 224 by flash is avoided. When the molding compound hardens, the molding die is unclamped and opened to take out the molded product.

Finally, the excess molding compound is removed from the substrate in a process known as "degating." During the degating process, the film 300 tends tend to adhere to the molding compound because the adhesive force between the film 300 and the molding compound is greater than the adhesive force between the film 300 and the substrate.

Figure 6:
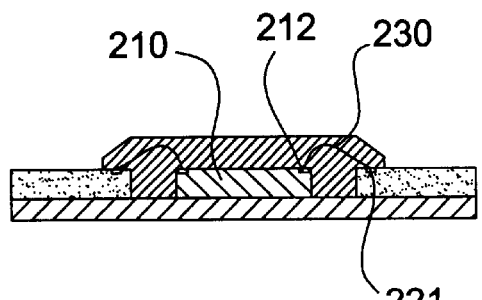
Figure 7:
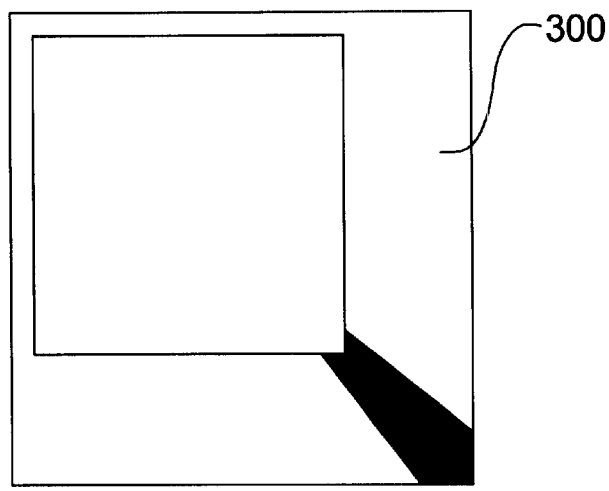

Therefore, the film 300 will be simultaneously removed along with the excess molding compound (see FIG. 7) during the degating process. This allows automatic ejection of the molded product by moveable pins built in the molding die thereby obtaining the cavity down BGA package as shown in FIG. 6. It should be understood that the method of making BGA package in accordance with the present invention may further comprise a step of mounting solder balls onto the solder pads 224.

The method of making BGA package in accordance with the present invention allows the film 300 to be removed along with the excess molding compound during degating process thereby automating the molding process. Further, the film 300 can be a disposable film; hence, the deformation problem due to repeating use can be avoided. Therefore, the flash problem can be significantly reduced by using a new film for each molding operation.

Although the invention has been explained in relation to its preferred embodiment, it is to be understood that many other possible modifications and variations can be made without departing from the spirit and scope of the invention as hereinafter claimed.

What is claimed is:

1. A method of making a ball grid array package comprising the steps of:
    providing a film having an opening defined therein;
    placing the film on a substrate;
    attaching a semiconductor chip onto the substrate such that the semiconductor chip is positioned in the opening of the film;
    electrically coupling the semiconductor chip to the substrate;
    providing a molding die having a runner, a gate and a molding cavity defined therein, the runner connected to the molding cavity through the gate;
    closing and clamping the molding die in a manner that the semiconductor chip is positioned in the molding cavity wherein the edges of the molding cavity fit entirely within the opening of the film and the edges of the runner and the gate are entirely positioned against the film;
    transferring a hardenable molding compound into the molding cavity;
    hardening the molding compound;
    unclamping and opening the molding die to take out the molded product; and
    simultaneously removing the film and degating.

2. The method as claimed in claim 1, wherein the film is made of heat-resistant material that does not warp during the molding process.

3. The method as claimed in claim 1, wherein the adhesive force between the film and the molding compound is greater than the adhesive force between the film and the substrate.

4. The method as claimed in claim 1, wherein the adhesive force between the film and the molding compound is ten times greater than the adhesive force between the film and the substrate.

5. A method of making a ball grid array package comprising the steps of:
    providing a film having an opening defined therein;
    providing a substrate having opposing upper and lower surfaces, the upper surface of the substrate being provided with a plurality of chip connection pads and a plurality of solder pads arranged about the periphery of the chip connection pads, the solder pads being electrically connected to corresponding chip connection pads;

placing the film on the upper surface of the substrate in a manner that the chip connection pads are positioned within the opening of the film;

attaching a semiconductor chip onto the substrate such that the semiconductor chip is positioned in the opening of the film, the semiconductor chip having a plurality of bonding pads;

electrically coupling the bonding pads of the semiconductor chip to the chip connection pads of the substrate;

providing a molding die having a runner, a gate and a molding cavity defined therein, the runner connected to the molding cavity through the gate;

closing and clamping the molding die in a manner that the semiconductor chip is positioned in the molding cavity wherein the edges of the molding cavity fit entirely within the opening of the film and the edges of the runner and the gate are entirely positioned against the film;

transferring a hardenable molding compound into the molding cavity;

hardening the molding compound;

unclamping and opening the molding die to take out the molded product; and simultaneously removing the film and degating.

6. The method as claimed in claim 5, wherein the film is made of heat-resistant material that does not warp during the molding process.

7. The method as claimed in claim 5, wherein the adhesive force between the film and the molding compound is greater than the adhesive force between the film and the substrate.

8. The method as claimed in claim 5, wherein the adhesive force between the film and the molding compound is ten times greater than the adhesive force between the film and the substrate.

9. The method as claimed in claim 5, wherein the substrate has a cavity adapted for supporting the semiconductor chip.

10. The method as claimed in claim 9, wherein the solder pads are arranged in a plurality of rows around the cavity of the substrate and the film covers those that are positioned next to the cavity of the substrate when the film is placed on the substrate.

11. The method as claimed in claim 5, further comprising the step of mounting a plurality of solder balls to the solder pads.

* * * * *